United States Patent [19]
Chern

[11] Patent Number: 6,166,954
[45] Date of Patent: Dec. 26, 2000

[54] SINGLE POLY NON-VOLATILE MEMORY HAVING A PMOS WRITE PATH AND AN NMOS READ PATH

[75] Inventor: Geeing-Chuan Chern, Cupertino, Calif.

[73] Assignee: Programmable Microelectronics Corporation, San Jose, Calif.

[21] Appl. No.: 09/352,027

[22] Filed: Jul. 14, 1999

[51] Int. Cl.[7] .................................................. G11C 16/04
[52] U.S. Cl. .............................. 365/185.14; 365/185.05; 257/318; 257/321
[58] Field of Search ....................... 365/185.14, 185.05, 365/185.06, 185.28; 257/318, 320, 321

[56] References Cited

U.S. PATENT DOCUMENTS

| | | |
|---|---|---|
| 5,736,764 | 4/1998 | Chang ...................................... 257/318 |
| 5,761,121 | 6/1998 | Chang ................................. 365/185.14 |
| 5,761,126 | 6/1998 | Chi et al. ............................ 365/185.14 |
| 5,841,165 | 11/1998 | Chang et al. ............................ 257/318 |
| 6,034,893 | 3/2000 | Mehta ................................. 365/185.14 |

*Primary Examiner*—Son T. Dinh
*Attorney, Agent, or Firm*—William L. Paradice, III

[57] ABSTRACT

A single-poly, floating gate memory cell includes a PMOS write and an NMOS read path. The memory cell's write path includes a PMOS half-transistor coupled in series with a PMOS write select transistor. The PMOS half-transistor serves as a storage element and includes a P+ drain region, a polysilicon floating gate, and a buried control gate. The read path includes an NMOS read transistor coupled in series with an NMOS read select transistor, where the floating gate of the PMOS half-transistor programming element serves as the gate of the NMOS read transistor. The memory cell is programmed along the PMOS write path by injecting electrons from a P-channel region of the PMOS half-transistor into the floating gate, and is read along the NMOS read path by conducting a channel current through an N-channel region of the NMOS read transistor.

30 Claims, 10 Drawing Sheets

SINGLE POLY NON-VOLATILE MEMORY HAVING A PMOS WRITE PATH AND AN NMOS READ PATH

BACKGROUND

1. Field of Invention

This invention relates generally to semiconductor memories and specifically to single-poly floating gate memory cells.

2. Description of Related Art

A single-poly non-volatile EEPROM cell includes only one polysilicon layer and is thus advantageous since the memory cell and its associated logic circuitry may be fabricated using the same semiconductor fabrication process. The single-poly cell includes a floating gate which overlies a channel region extending between source and drain regions of the memory cell. The single-poly cell includes a buried control gate that is capacitively coupled to the floating gate in a manner similar to that of an MOS capacitor. Although early single-poly memory cells were primarily fabricated using NMOS technology, recent advances in the semiconductor industry have led to the development of a PMOS single-poly floating gate memory cell such as, for instance, that disclosed in U.S. Pat. No. 5,736,764 issued Apr. 7, 1998 to Chang, entitled "PMOS Flash EEPROM Cell with Single Poly" and assigned to Programmable Microelectronics Corporation of San Jose, Calif.

FIGS. 1 and 2A–2C illustrate a PMOS single-poly memory cell of the type disclosed in the Chang patent. The cell 10 is formed in an N-well 12 provided within a P-type substrate 14, and includes a P-channel programming transistor 16 and a P-channel select transistor 18. P+ diffusion region 20 serves as the source of programming transistor 16, P+ diffusion region 22 serves as both the drain of programming transistor 16 and the source of select transistor 18, and P+ diffusion region 24, which is coupled to a bit line BL, serves as the drain of select transistor 18. Poly-silicon gates 26 and 28 serve as the floating gate and select gate, respectively, of cell 10.

A P-type buried diffusion layer 36 serves as the control gate of cell 10. A contact region 38 is opened in floating gate 26 and in a layer of oxide 40 interposed between floating gate 26 and control gate 36 to enable electrical contact with buried control gate 36. A layer of oxide 40 is provided between floating gate 26 and P diffusion region 36. Application of a bias voltage to control gate 36 enhances a channel 30 extending between source 20 and drain 22 of programming transistor 16, and the application of a bias voltage to select gate 28 enhances a channel 32 extending between source 22 and drain 24 of select transistor 18. Together, floating gate 26 and control gate 36 form an MOS capacitor in a manner similar to that of conventional N-channel EEPROM cells.

The cell 10 is programmed by injecting electrons into the floating gate 26 from a depletion layer proximate drain 22. The resultant accumulation of negative charge on the floating gate 26 moves the threshold voltage of the cell 10 to a more positive voltage. The cell 10 is erased by electron tunneling from the floating gate 26 into channel 30, source 20, and drain 22, which returns the threshold voltage of the programming transistor 16 of cell 10 to its erased value. To read cell 10, a voltage differential is applied between P+ source 20 and P+ drain 22, and a suitable read voltage is applied to the control gate 36. The cell 10 conducts a channel current during read operations only if the floating gate 26 is charged, i.e., only if the cell 10 is programmed. For a more detailed discussion of PMOS single-poly floating gate memory cells, see also U.S. Pat. No. 5,761,121 issued Jun. 2, 1998 to Chang entitled "PMOS single-poly non-volatile memory structure," and U.S. Pat. No. 5,841,165 issued Nov. 24, 1998 to Chang and entitled "PMOS Flash EEPROM Cell with Single Poly."

PMOS floating gate memory cells such as the cell 10 are advantageous over NMOS floating gate memory cells in several respects. For example, since PMOS transistors exhibit higher gate currents than do NMOS transistors, PMOS floating gate memory cells use lower programming voltages than do NMOS floating gate memory cells. Further, since these lower programming voltages exhibit lower junction voltages, the PMOS cell size is not as limited by junction breakdown as is NMOS cell size. In addition, since a read current flows through a PMOS floating gate memory cell only when the floating gate is charged, PMOS cells do not suffer from read disturb problems characteristic of NMOS floating gate memory cells.

However, although advantageous in numerous respects over NMOS memory cells, the lower mobility of holes, as compared to that of electrons, undesirably limits the channel current of PMOS memory cells during read operations. This channel current limitation, in turn, undesirably limits the speed with which PMOS floating gate memory cells are read. Accordingly, it would be desirable for a single-poly floating gate memory cell to achieve programming advantages of PMOS memory cells without sacrificing memory cell access time.

SUMMARY

A new single-poly, floating gate memory cell is disclosed which includes a PMOS write and an NMOS read path. In accordance with the present invention, the memory cell's write path includes a PMOS half-transistor coupled in series with a PMOS write select transistor. The PMOS half-transistor includes a P+ drain region, a polysilicon floating gate, and a buried control gate, wherein the floating gate serves as a storage element. In one embodiment, the read path includes an NMOS read transistor coupled in series with an NMOS read select transistor, where the floating gate of the PMOS half-transistor programming element is also the gate of the NMOS read transistor. The memory cell is programmed along the PMOS write path by injecting electrons from a P-channel region of the PMOS half-transistor into the floating gate, and is read along the NMOS read path by detecting a channel current through an N-channel region of the NMOS read transistor. Here, by combining a PMOS write path and an NMOS read path, present embodiments are able to independently optimize PMOS programming operations and NMOS reading operations. That is, since holes exhibit a much higher gate current than do electrons, the cell's programming efficiency is maximized by utilizing a PMOS write path, and since electrons exhibit a much higher channel current than do holes, the cell's access speed is maximized by utilizing an NMOS read path.

BRIEF DESCRIPTION OF THE DRAWINGS

Like reference numerals refer to corresponding parts throughout the drawing figures.

DETAILED DESCRIPTION

Figure 1:
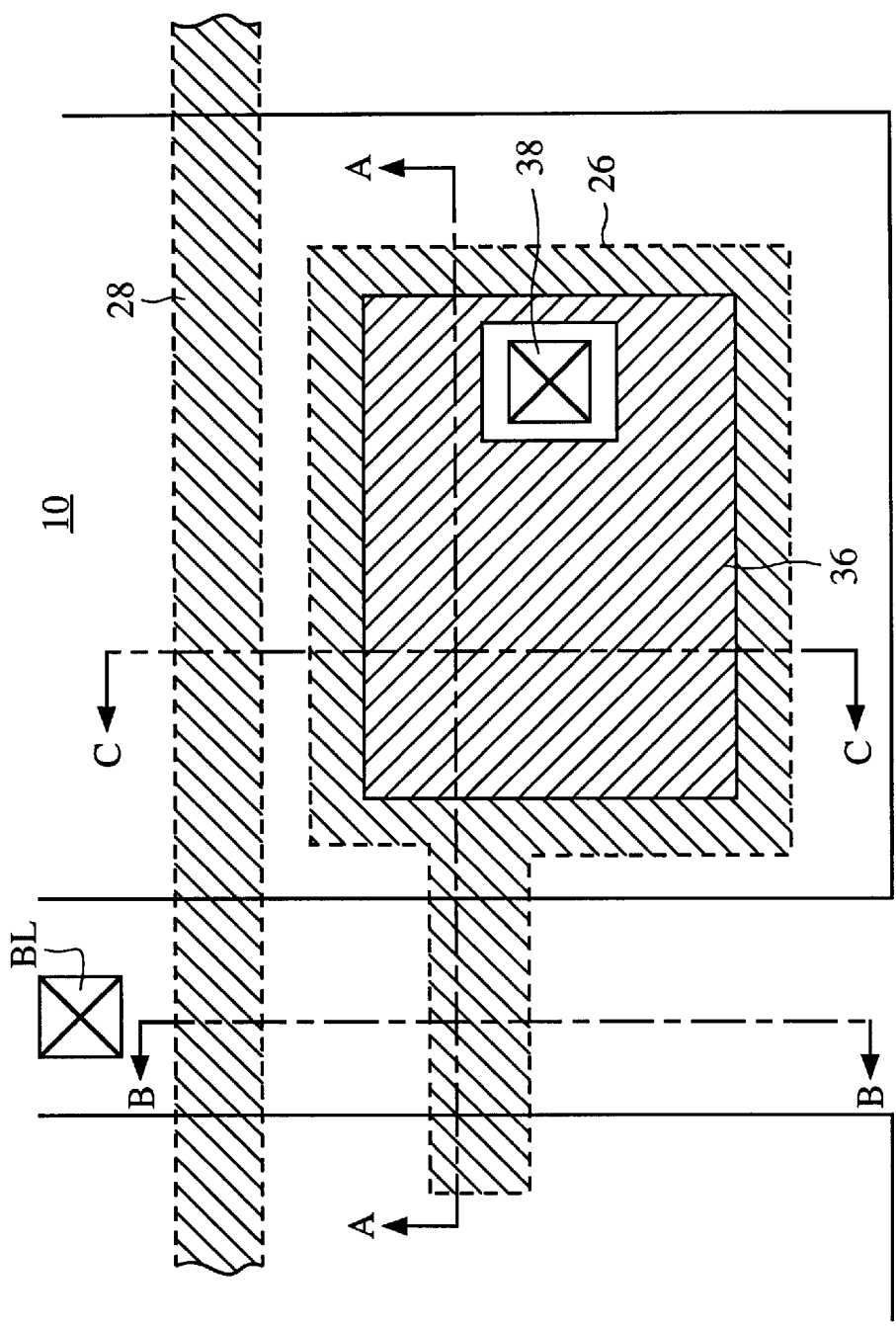
FIG. 1 is a top view of a conventional PMOS single-poly floating gate memory cell.
Figure 2A:
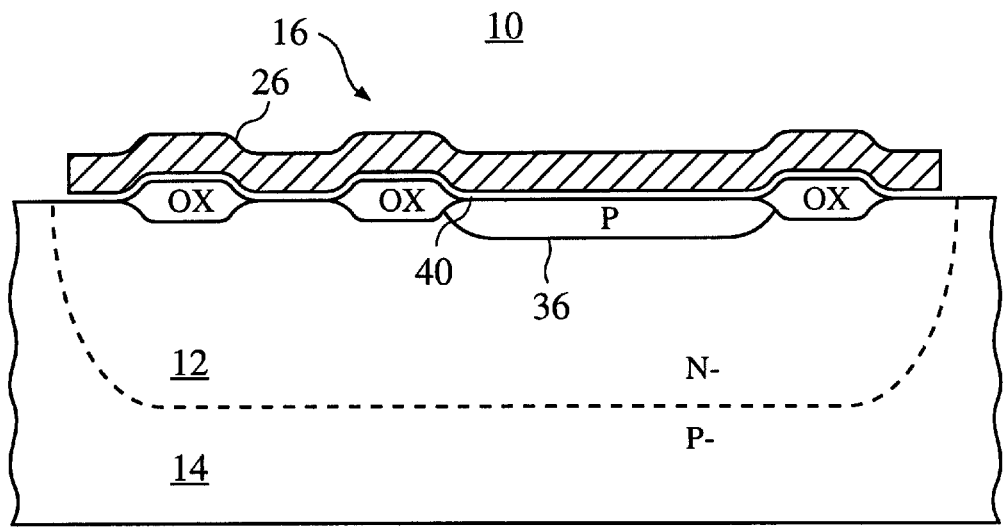
FIG. 2A is a cross-sectional view of the PMOS cell of FIG. 1 taken along line A-A'.
Figure 2B:
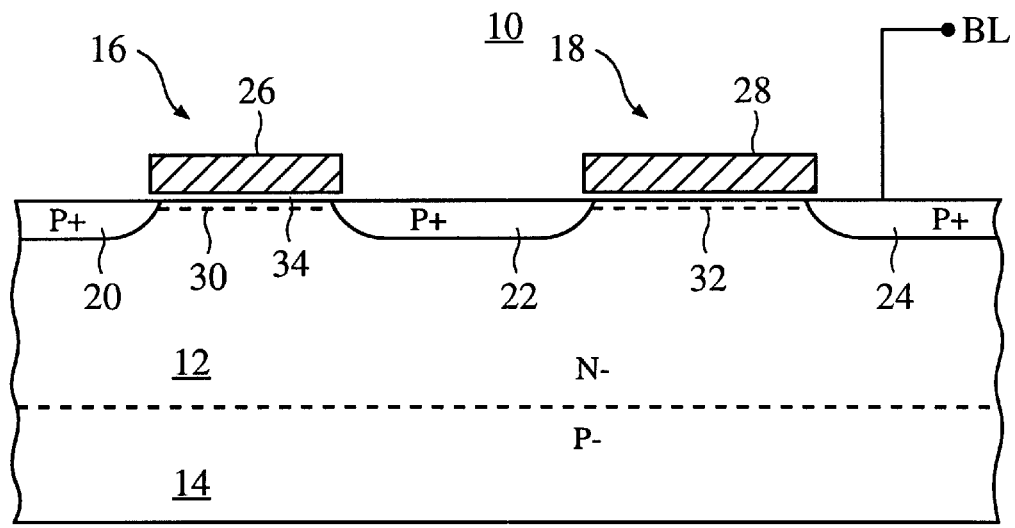
FIG. 2B is a cross-sectional view of the PMOS cell of FIG. 1 taken along line B-B'.
Figure 2C:
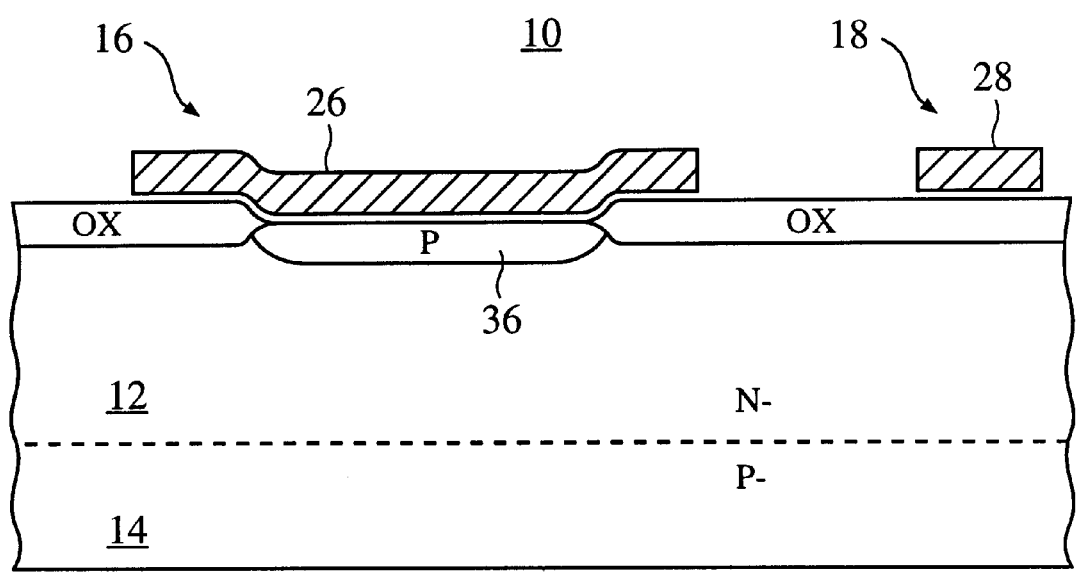
FIG. 2C is a cross-sectional view of the PMOS cell of FIG. 1 taken along line C-C'.
Figure 3:
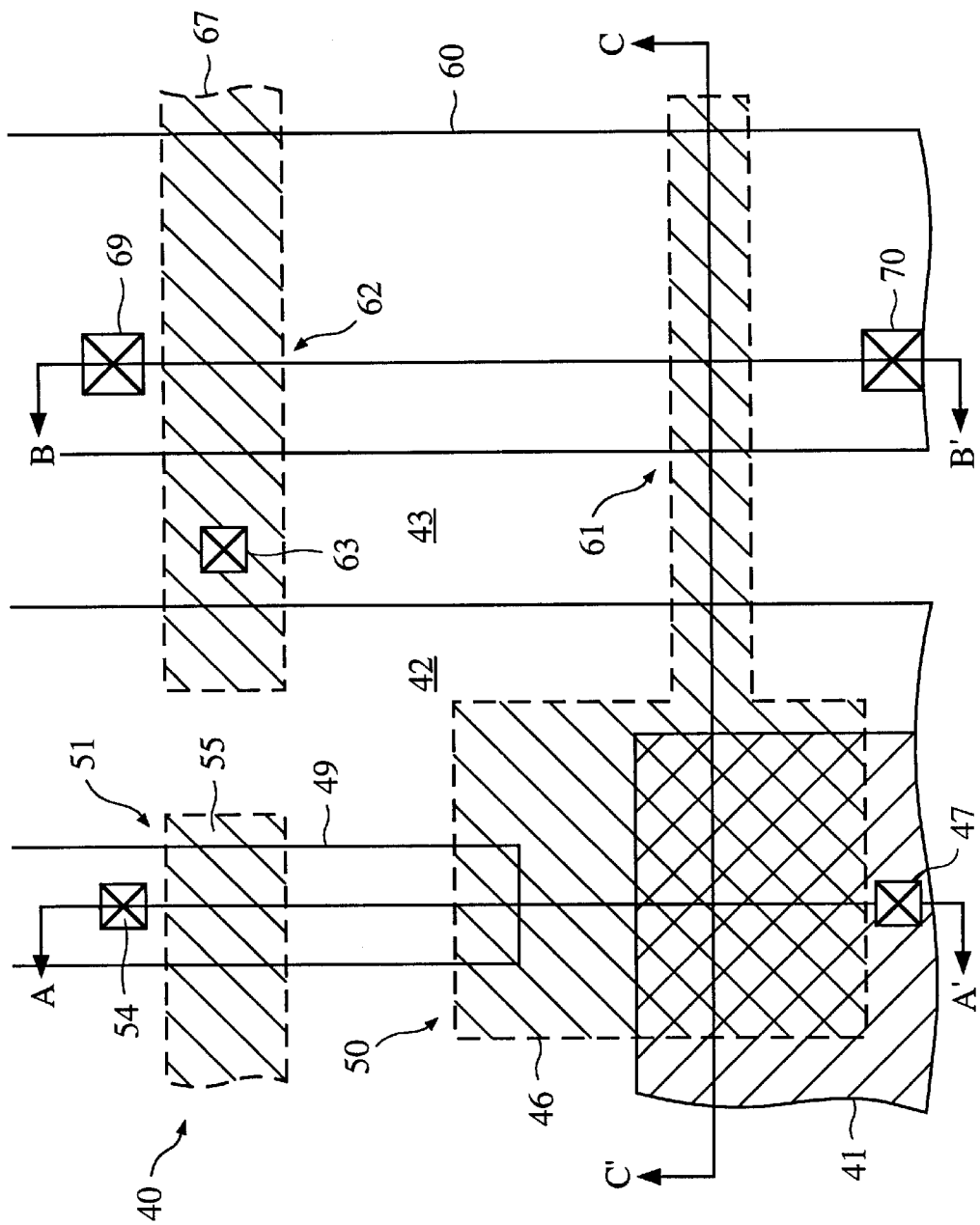
FIG. 3 is a top view of a single-poly floating gate memory cell in accordance with the present invention.
Figure 4A:
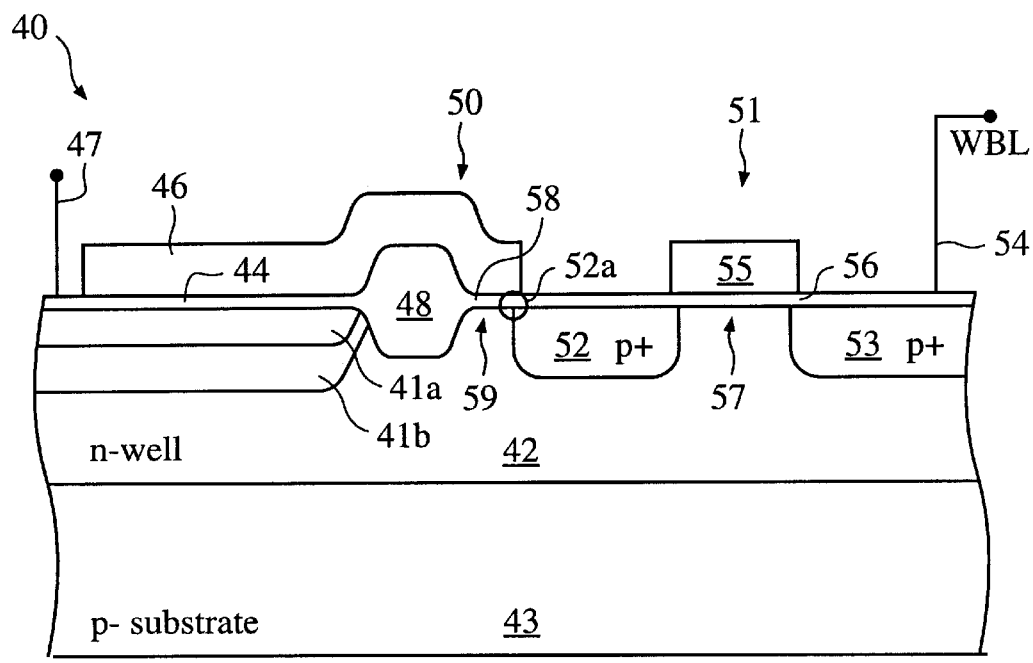
FIG. 4A is a cross-sectional view of the memory cell of FIG. 3 taken along line A-A'.

Referring to FIG. 3, a single-poly non-volatile memory cell 40 in accordance with the present invention includes a PMOS write path and an NMOS read path. The PMOS write path extends along line AA', and the NMOS read path extends along line BB'. The memory cell 40 includes a buried control gate 41 formed within an N-well 42 of a P-substrate 43. Referring also to FIG. 4A, which shows a cross-sectional view of the cell 40 along the PMOS write path AA', control gate 41 preferably includes an N type diffusion region 41a formed within a P type diffusion region 41b. In one embodiment, the N type diffusion region 41a has a dopant concentration of between 5E17-1E19 cm$^{-3}$, and the P type diffusion region 41b has a dopant concentration of between 5E16-1E18 cm$^{-3}$. The buried N type region 41a serves as the control gate for the cell 40, and the buried P type diffusion region 41b electrically isolates the N type region 41a from the N-well 42, thereby allowing the N type region 41a to maintain voltages more positive or negative than the N-well 42 without leakage. A layer of oxide 44 between 75–350 Å thick is provided between a floating gate 46 and the buried control gate 41. A contact 47 enables electrical contact with the buried control gate 41. Together, floating gate 46 and control gate 41 form an MOS capacitor in a manner similar to that of a conventional stacked gate memory cell, thereby allowing voltages applied to the control gate 41 to be coupled to the floating gate 46.

Referring to both FIGS. 3 and 4A, a field oxide region 48 isolates the control gate 41 from an active region 49 formed in the N-well 42. The active region 49 includes a PMOS half-transistor 50 and a PMOS write select transistor 51. A P+ diffusion region 52 serves as the drain of the PMOS half-transistor 50 and as the source of the write select transistor 51. A P+ diffusion region 53 serves as the drain of the PMOS write select transistor 51, and is connected to an associated write bit line WBL via a contact 54. The write select transistor includes a polysilicon gate 55 which is isolated from the active region 49 by an oxide layer 56. In one embodiment, gate oxide 56 is between 100–300 Å thick. The floating gate 46, a portion of which overlies P+ diffusion region 52, serves as the gate for the PMOS half-transistor 50. A layer of tunnel oxide 58 between 70–120 Å thick is formed between the floating gate 46 and a channel region 59 of the PMOS half-transistor 50.

In some embodiments, a uniform dopant implantation step is employed prior to the formation of the floating gate 46 to increase the N type dopant concentration in the channel region 59 proximate to P+ diffusion region 52, including portion 52a shown in FIG. 4A. In other embodiments, dopants are implanted after formation of the floating gate 46 via well known angled implantation techniques to increase the dopant concentration in region 52a of the PMOS half transistor 50. In either embodiment, the dopant implants are used to increase PMOS programming efficiency.

Figure 4B:
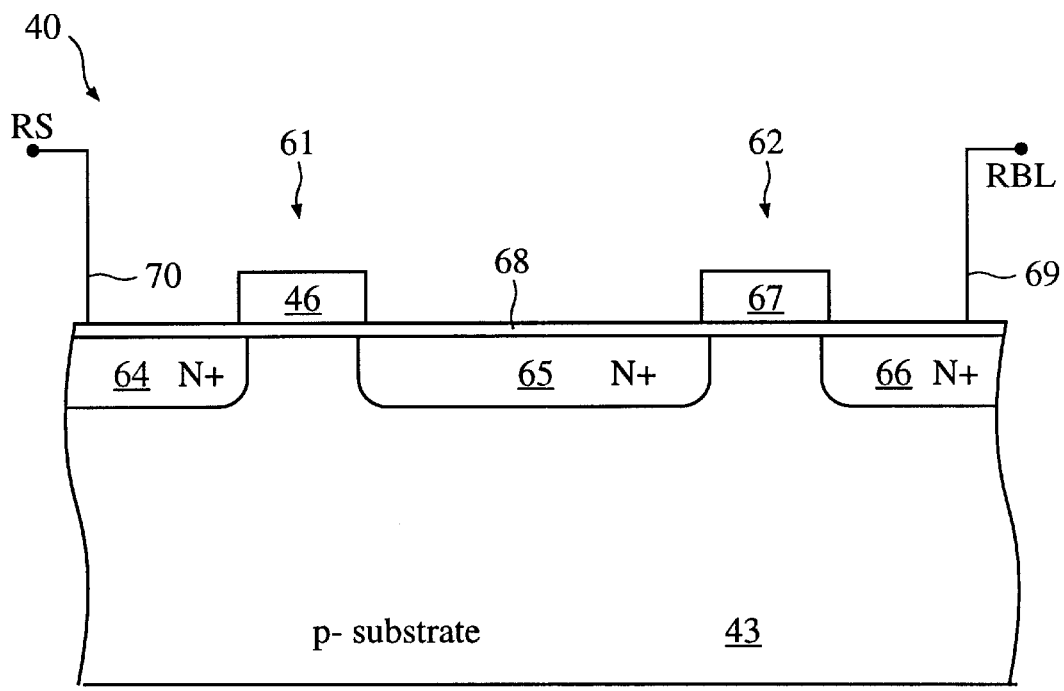
FIG. 4B is a cross-sectional view of the memory cell of FIG. 3 taken along line B-B'.

Referring now to FIGS. 3 and 4B, the floating gate 46 extends along line CC' and overlies an active region 60 formed in the P-substrate 43. The active region 60 includes an NMOS read transistor 61 and an NMOS read select transistor 62. An N+ diffusion region 64 serves as the source for the read transistor 61, an N+ diffusion region 65 serves as the source for the read transistor 61 and as the drain of the read select transistor 62, and an N+ diffusion region 66 serves as the drain for the read select transistor 62. The floating gate 46 also serves as a gate for the read transistor 61. Polysilicon 67 serves as a gate for the read select transistor 62. The floating gate 46 and read select gate 67 are insulated from the active region 60 by an oxide layer 68 between 30–150 Å thick. In some embodiments, portions of the oxide layer 68 underlying the gate 46 of the read transistor 61 may be of a different thickness than portions of the oxide layer 68 underlying the gate 67 of the read select transistor 62. A contact 69 connects the N+ drain 66 of read select transistor 62 to an associated read bit line RBL, and a contact 70 connects the N+ source 64 of read transistor 61 to an associated read source line RS. A contact 63 is used to apply suitable bias voltages to the read select gate 67.

Figure 4C:
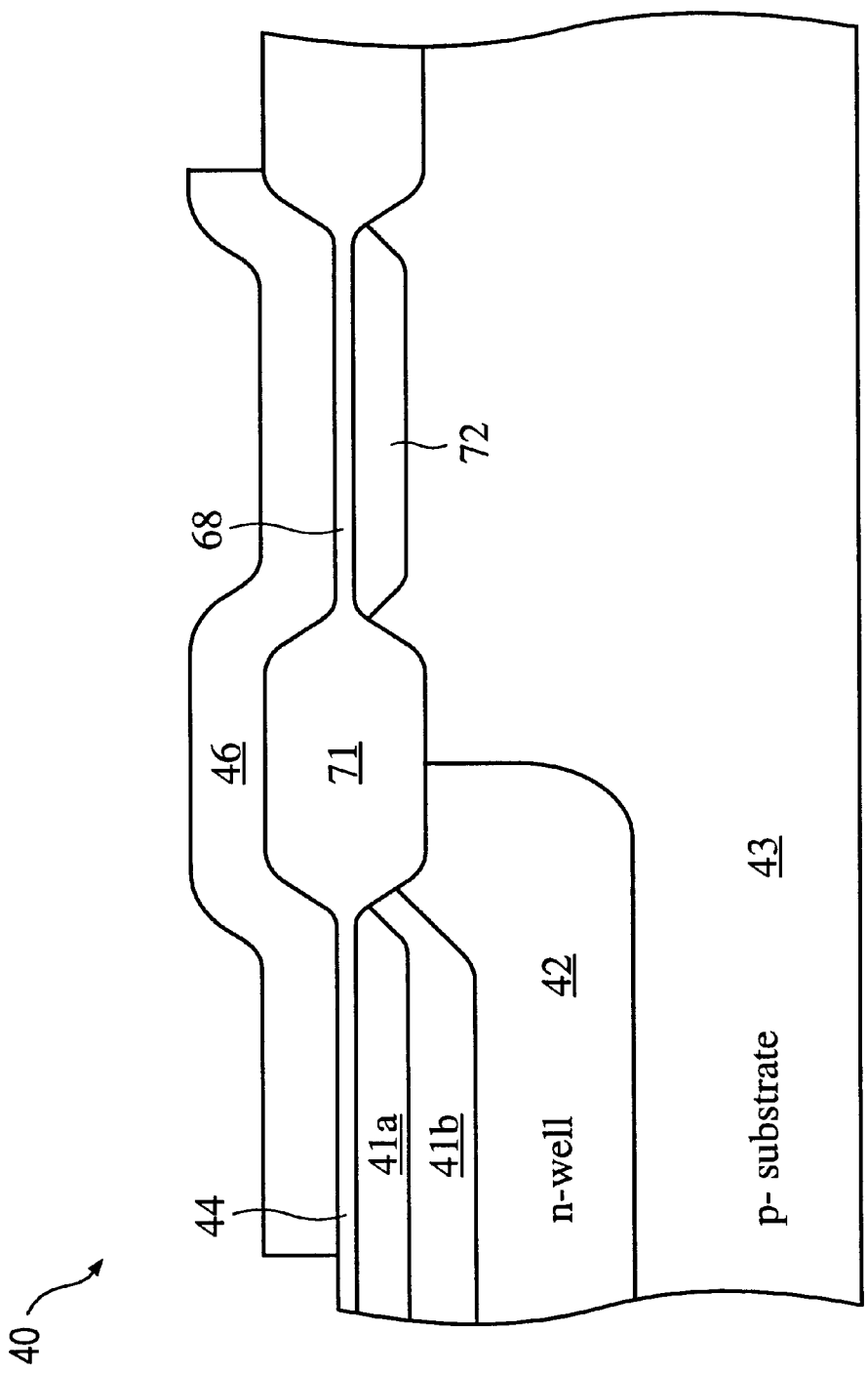
FIG. 4C is a cross-sectional view of the memory cell of FIG. 3 taken along line C-C'.

Referring now to FIGS. 3 and 4C, the control gate 41 is isolated from active region 60 by a field oxide region 71. In one embodiment, a depletion implant 72 is formed within p-substrate 43 using suitable implantation techniques to more precisely control the threshold voltage of the read transistor 61. Similarly, other threshold voltage adjustment implants may be used to adjust the respective threshold voltages of the read select transistor 62 and the write select transistor 51. In one embodiment, the programmable PMOS half-transistor 50 has a threshold voltage of approximately between −0.2 to −5.0 volts, the PMOS write select transistor 51 has a threshold voltage of approximately between −0.2 to −1.5 volts, the NMOS read transistor 61 initially has a threshold voltage of approximately between −2.0 to 2.0 volts, and the NMOS read select transistor 62 has a threshold voltage of approximately between 0.2 to 1.5 volts.

The cell 40 is programmed primarily via band-to-band tunneling induced injection of hot electrons into the floating gate and, to a much lesser degree, via Fowler-Nordheim tunneling. In one embodiment, programming is accomplished by applying approximately −6 volts to the write bit line WBL, applying approximately −8 volts to the write select gate 55, and applying approximately 10 volts to the control gate 41. The coupling ratio between the control gate 41 and the floating gate 46 is approximately 65%, and thus approximately 6.5 volts is coupled to the floating gate 46. The N-well region 42 is biased at approximately 5 volts, and the P-substrate 43 is grounded. Under these bias conditions, the PMOS write select transistor 51 turns on and passes the negative voltage on the write bit line WBL to the P+ diffusion region 52. The p/n junction formed by P+ drain 52 and N-well 42 becomes reverse biased and facilitates the band-to-band tunneling of electrons across that p/n junction.

The resultant high energy electrons are injected from region 52a into the floating gate 46. The resultant accumulation of negative charge on the floating gate 46 programs the cell 40. In other embodiments, the N+ source 64 of the read transistor 61 is held at approximately 8 volts with the read bit line RBL floating to prevent current flow via the read bit line RBL. With the control gate 41 biased during programming, the channel region of transistor 61 is turned on, and an inversion layer is formed. This inversion layer is connected to the N+ source 64 and couples additional voltage to the floating gate 46 and thereby further enhances programming speed. The read select gate 67 may be at any desired potential.

The cell 40 is selected for reading by applying approximately 2 volts to the read bit line RBL and connecting the read select gate 67 to a supply voltage $V_{CC}$, thereby turning on the read select transistor 62. The supply voltage $V_{CC}$ may be any suitable supply between 1–6 volts. Approximately 1 volt is applied to the control gate 41 while grounding the N+ source 64 of the read transistor 61. Under these bias conditions, the read transistor 61 will conduct a channel current and thereby pull the read bit line RBL to a lower potential only in the absence of significant negative charge on the floating gate 46, i.e., only if the cell 40 is in an erased state. Conversely, if the cell 40 is in the programmed state, i.e., if the floating gate 46 is negatively charged due to the above-described programming technique, the read transistor 61 will not conduct a channel current and will therefore not pull the read bit line RBL to the lower potential. Thus, in accordance with present embodiments, the logic state of the floating gate 46, as determined by the presence of either positive (erased state) or negative (programmed state) charge thereon, directly controls the conductivity of the NMOS read path.

The NMOS read transistor 61 is preferably a depletion mode device so that an uncharged floating gate 46 turns on the read transistor 61 and a negatively charged floating gate 46 turns off the read transistor 61, thereby allowing the use of lower control gate voltages during read operations which, in turn, minimizes read disturb. The NMOS read select transistor 62, on the other hand, is preferably an enhancement mode device so that a grounded read select gate 67 turns off the read select transistor 62 and a positive voltage on the read select gate 67 turns on the read select transistor 62. Otherwise, if the read select transistor 62 were a depletion mode device, a negative voltage would undesirably be required to turn off the read select transistor.

The cell 40 is erased by applying approximately –10 volts to the control gate 41, grounding the P– substrate 43, grounding or floating the N+ read source 64, applying approximately 6 volts to the N-well 42, and the write bit line WBL is connected to the N-well 42 while the write select gate 55 is grounded. This way the write select transistor 51 is turned on and, therefore, the P+ region 52 is connected to the write bit line WBL and N-well 42. The negative potential on the control gate 41 repels electrons from the floating gate 46 and into the P+ region 52 and N-well 42, thereby removing the accumulation of negative charge on the floating gate 46 which, in the erased condition, may be slightly positively charged.

Acceptable voltage ranges (in volts) for programming, reading, and erasing operations of the cell 40 are summarized below in Table 1, where d/c is any voltage or floating.

TABLE 1

| Node | Program (1) | Program (2) | Read | Erase |
|---|---|---|---|---|
| RBL | float | float | 0.5 to 5.0 | float |
| Read SEL | d/c | d/c | $V_{CC}$ | d/c |
| Read Source | d/c | 5 to 15 | 0 | 0 or float |
| WBL | –3 to –10 | –3 to –10 | d/c | at N-well |
| Write SEL | –5 to –12 | –5 to –12 | $V_{CC}$ | 0 |
| N-well | 1 to 6 | 1 to 6 | $V_{CC}$ | $V_{CC}$ to 12 |
| Control Gate | 5 to 15 | 5 to 15 | –1 to 3 | –5 to –15 |
| Substrate | 0 | 0 | 0 | 0 |

As described above, the memory cell 40 includes a PMOS write path and an NMOS read path. Thus, unlike conventional floating gate memory cells which use transistors of the same conductivity type for reading and writing operations, present embodiments allow for the independent optimization of the PMOS path for write operations and the NMOS path for read operations. That is, present embodiments are able to capitalize on the advantages of PMOS programming operations and the advantages of NMOS reading operations without sacrificing performance of the other.

The characteristic gate current for PMOS devices is approximately 50 times that of NMOS devices. Thus, while conventional NMOS non-volatile memory cells typically require approximately a 0.5 mA programming current, the PMOS write path of the cell 40 requires a programming current of only a few nano-amps. This lower programming current advantageously uses requires lower programming voltages and, therefore, consumes less power during programming operations. Further, since the lower programming voltages result in lower p/n junction voltages along the PMOS write path, the PMOS write devices 50 and 51 may be scaled down to a much greater extent than could NMOS write devices. Accordingly, present embodiments are particularly well suited for next generation fabrication techniques, i.e., fabrication technologies with smaller geometries.

Since electrons have a higher mobility than do holes, NMOS devices achieve higher channel currents than do PMOS devices. Thus, by using an NMOS read path instead of a PMOS read path, where as described above the read path is formed by the NMOS read transistor 61 and the NMOS read select transistor 62, present embodiments maximize the read current and, thus, achieve greater read speeds, as compared to that of a PMOS read path. Conversely, since holes exhibit a higher gate current than electrons, programming the cell 40 through the P+ drain 52 of the PMOS half-transistor 50 allows for greater programming efficiency, as compared to that of an NMOS write path.

Using PMOS technology for writing and NMOS technology for reading also allows for optimization of the active area dimensions of the memory cell 40. Thus, in accordance with the present invention, the active area 60 of the NMOS read path may be widened so maximize the read current without undesirably reducing the coupling ratio between the control gate 41 and the floating gate 46. This is in contrast to conventional floating gate memory devices, where any increase in the width of the write/read channel region to increase the read current undesirably reduces the coupling ratio between the control gate 41 and the floating gate 46 and, therefore, undesirably reduces programming efficiency.

In addition, using a PMOS write path and an NMOS read path allows for the gate oxide 56 of the PMOS write select transistor 51 to be greater than the gate oxide 68 of the NMOS read select transistor 62. Thus, when scaling down the memory cell 40, the thickness of the read select gate oxide 68 may be reduced accordingly while maintaining a suitable thickness for the write tunnel oxide 58. Otherwise, any reduction in the gate oxide thickness to achieve faster read speeds is necessarily limited by the breakdown voltage characteristics during programming operations and, conversely, maintaining a suitable gate oxide thickness to prevent cell breakdown undesirably limits the read current.

Figure 5:
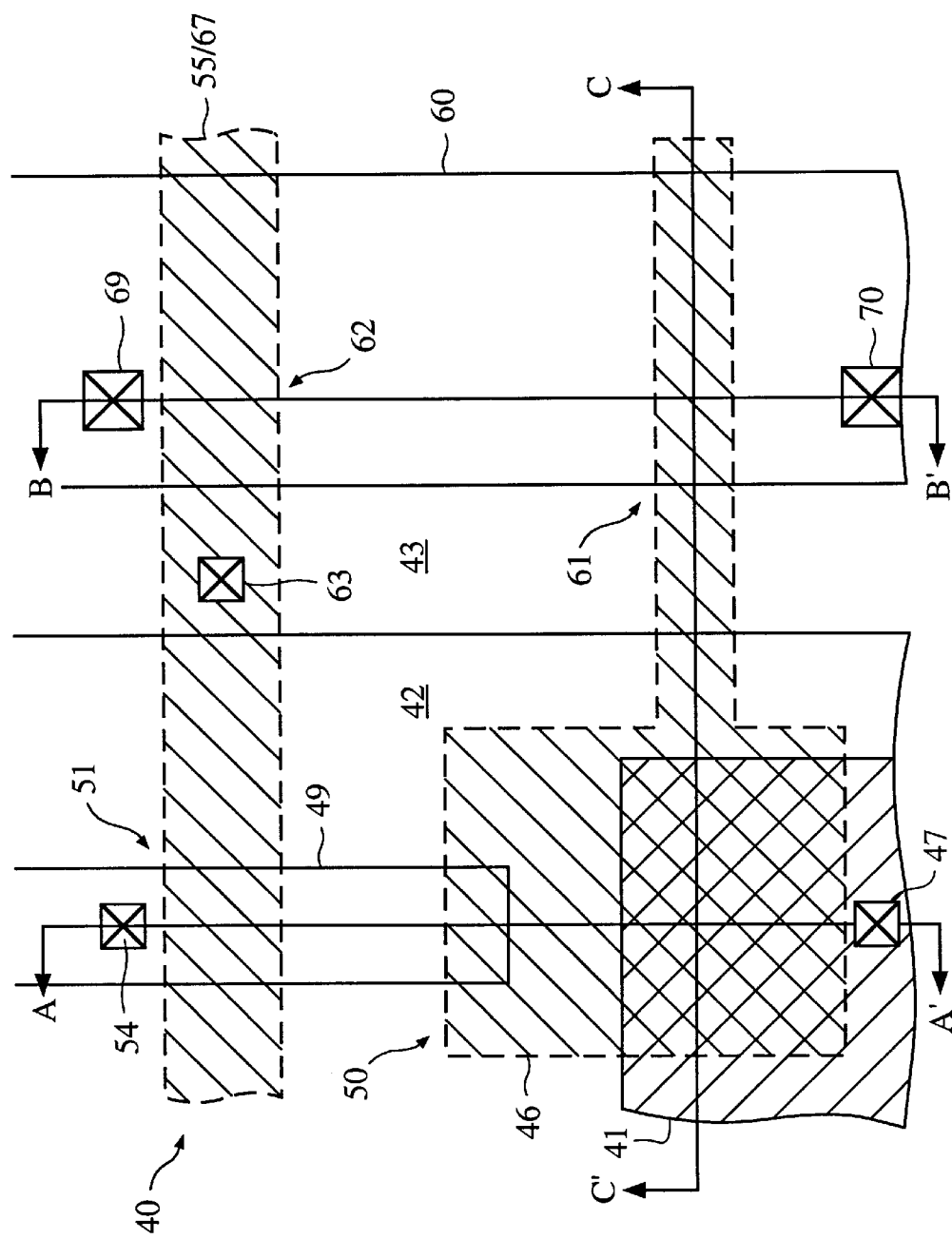
FIG. 5 is a top view of a single-poly floating gate memory cell in accordance with an alternate embodiment of the present invention.

In another embodiment, a continuous polysilicon gate serves as the write select gate 55 and the read select gate 67, as illustrated in FIG. 5. Using one continuous polysilicon gate 55/67 for the write select gate and the read select gate advantageously simplifies both the fabrication process and circuit complexity. However, in this embodiment, the respective gate oxides for the write select transistor 51 and the read select transistor 62 are necessarily the same, and therefore are not independently optimized.

Figure 6:
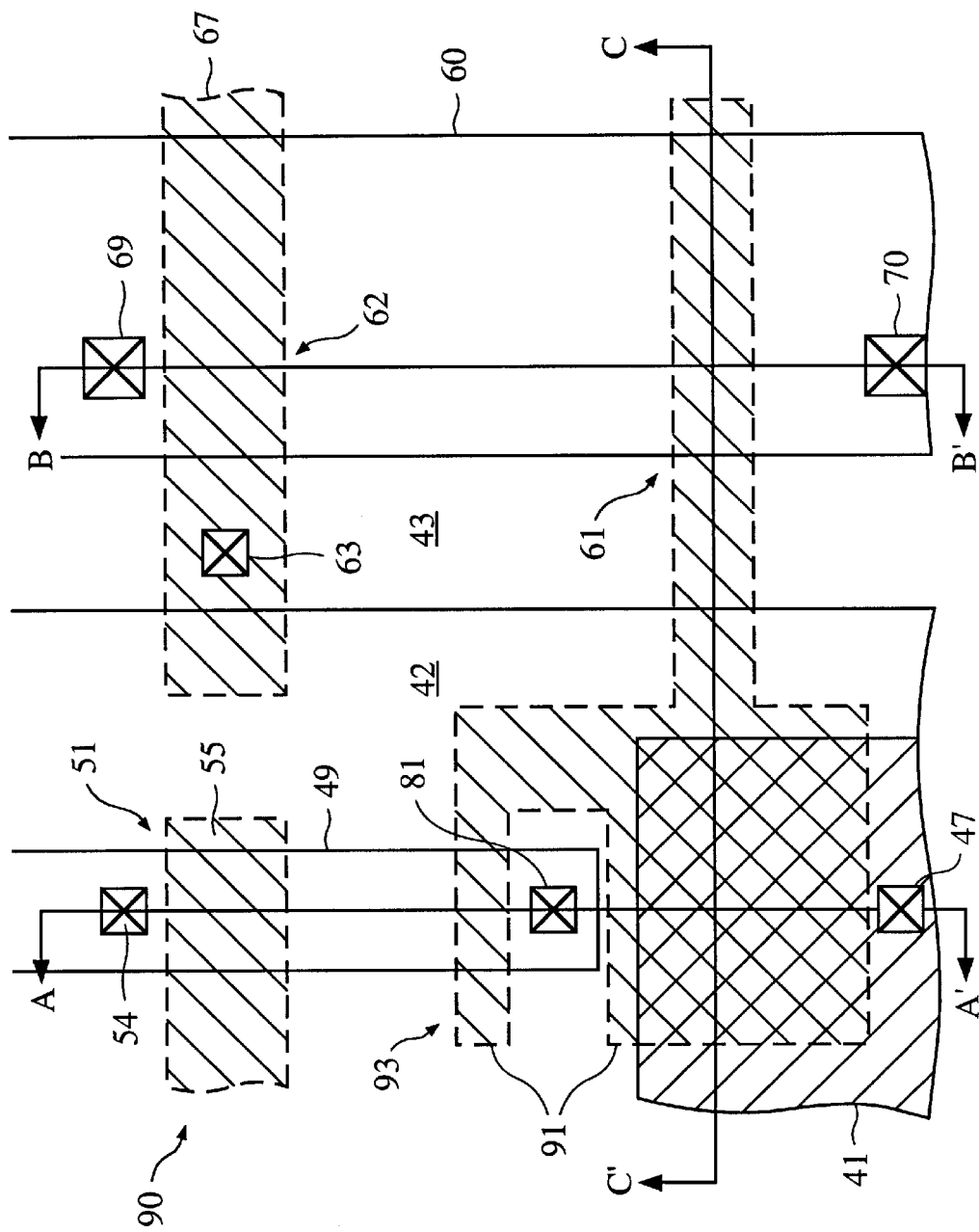
FIG. 6 is a top view of a single-poly floating gate memory cell in accordance with another embodiment of the present invention.
Figure 7A:
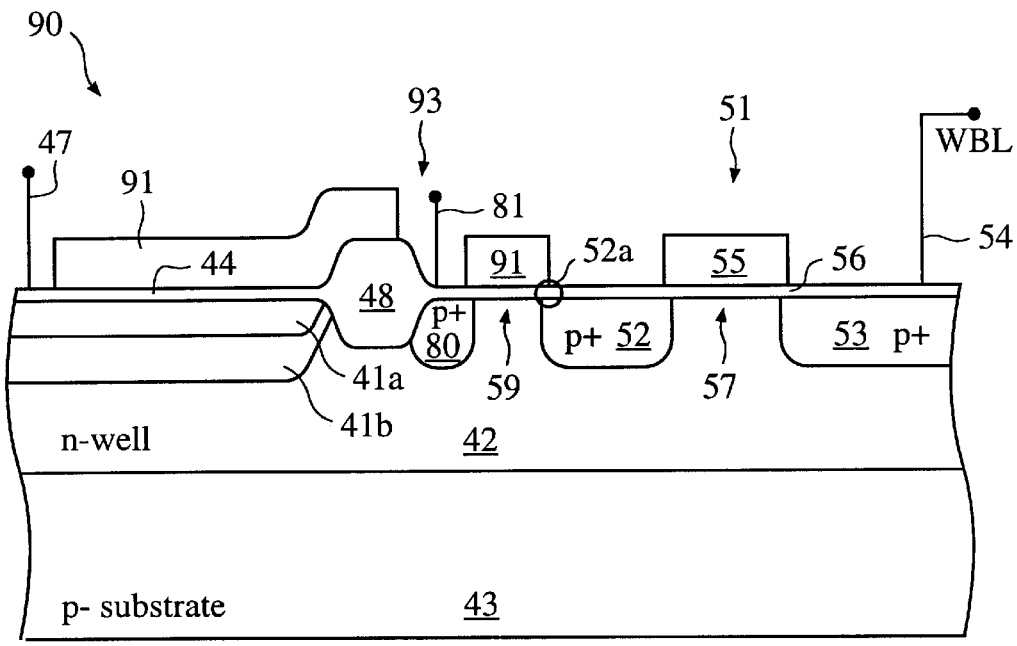
FIG. 7A is a cross-sectional view of the memory cell of FIG. 6 taken along line A-A'.
Figure 7B:
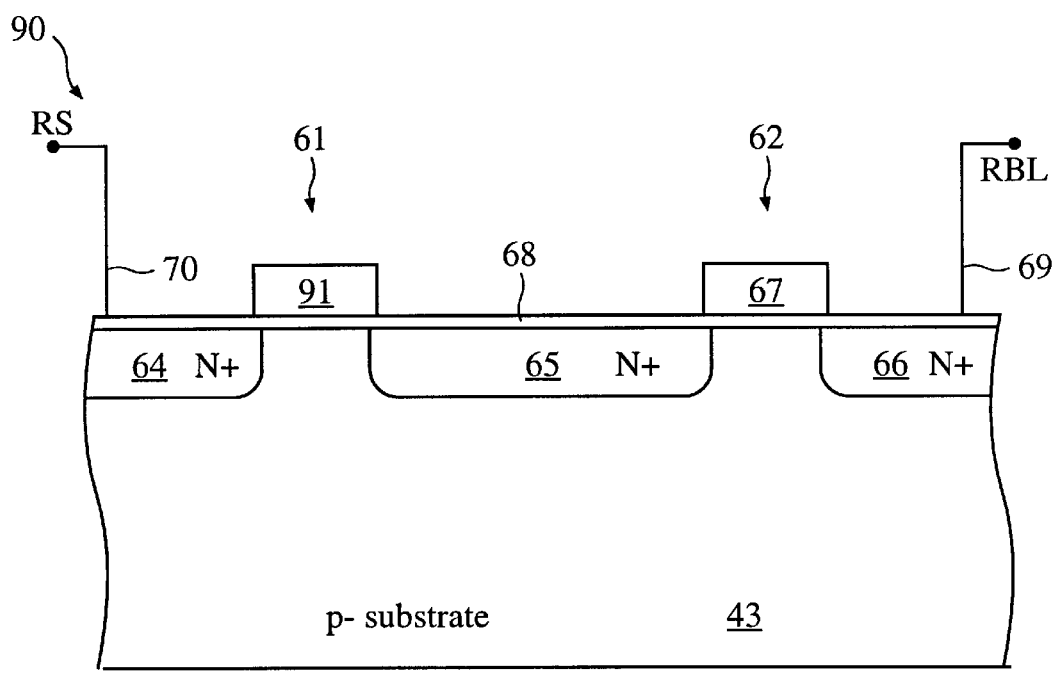
FIG. 7B is a cross-sectional view of the memory cell of FIG. 6 taken along line B-B'.
Figure 7C:
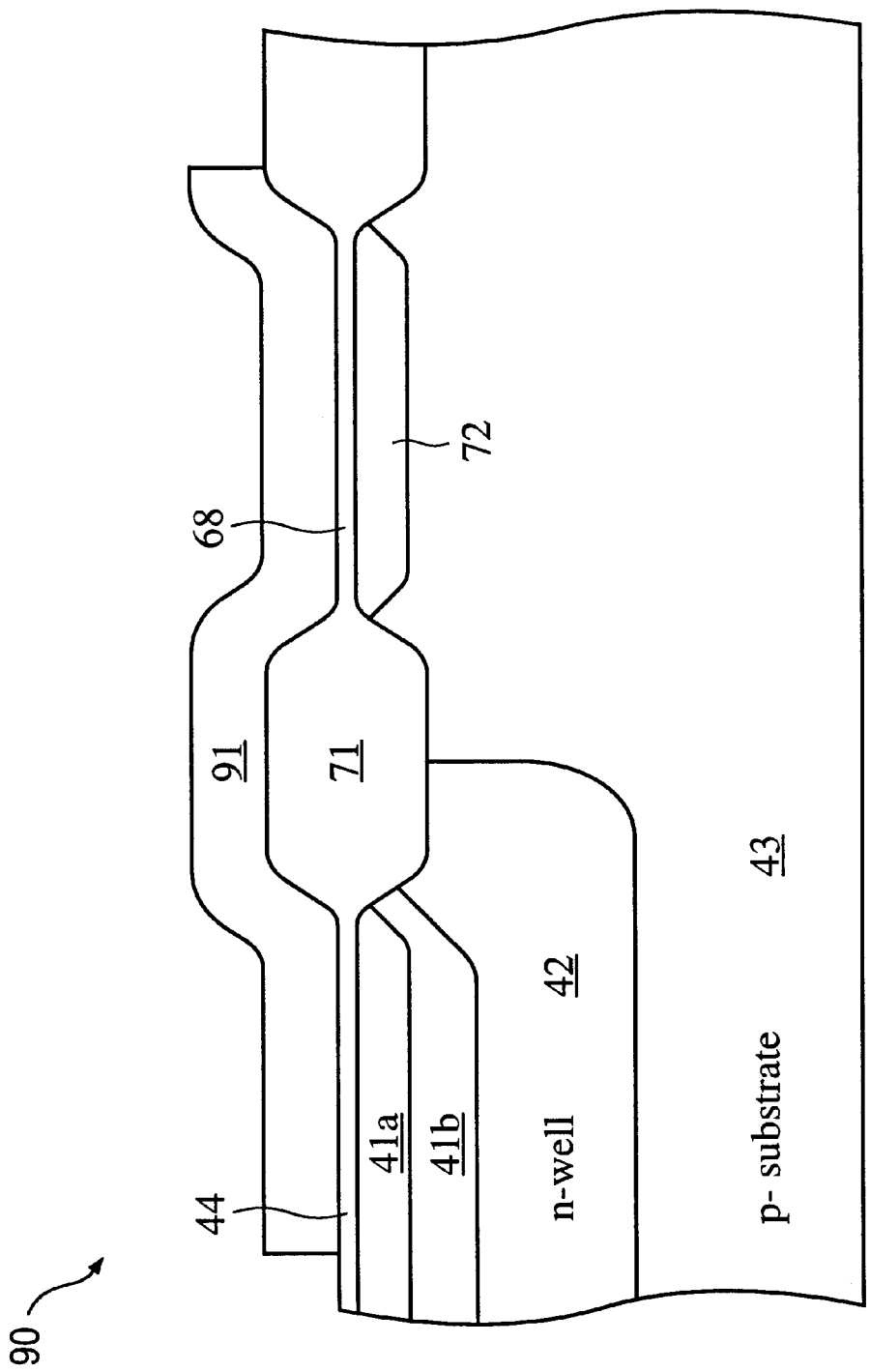
FIG. 7C is a cross-sectional view of the memory cell of FIG. 6 taken along line C-C'.

Referring to FIGS. 6 and 7A–7C, a cell 90 in accordance with another embodiment is disclosed in which programming is accomplished with a channel current via the injection of hot electrons. Here, the cell 90 is a modification of the cell 40 of FIGS. 3 and 4A–4C. Here, a P+ source region 80 is formed within the N-well 42 at opposite end of the P-channel 59 from the P+ diffusion region 52. Thus, the cell 90 of FIG. 6 includes a full PMOS write transistor 93 having a source 80 and a drain 52, as compared to the PMOS half-transistor 50 of the cell 40 (FIGS. 3 and 4A–4C). Here, the floating gate 91 is cut to allow for formation of the P+ source region 80 of the PMOS write transistor 93, as shown in FIG. 6. A contact 81 allows for the application voltages to the P+ source 80. During programming operations, holes accelerate across the P-channel 59 from the P+ source 80 towards the P+ drain region 52, where they collide with lattice atoms proximate portion 52*a*. Hot generated by the resultant impact ionization are injected into the floating gate 91, thereby programming the cell 90. Since the threshold voltage of the cell is shifted during programming, the control gate voltage can be increased for better programming efficiency. For example, the control gate voltage may be ramped from approximately 0 to 6 volts, where the N-well and the write source at held at approximately 8 volts. Reading and erasing operations are similar to that described above with respect to the cell 40 of FIGS. 3 and 4A–4C.

Acceptable voltage ranges (in volts) for programming, reading, and erasing operations of the cell 90 are summarized below in Table 2, where d/c is any voltage or floating.

TABLE 2

| Node | Program (1) | Program (2) | Read | Erase |
|---|---|---|---|---|
| RBL | float | float | 0.5 to 5 | float |
| Read SEL | d/c | d/c | $V_{CC}$ | d/c |
| Read Source | d/c | 5 to 15 | 0 | 0 or float |
| WBL | −2 to 1 | −2 to 1 | d/c | at N-well |
| Write SEL | −3 to 0 | −3 to 0 | $V_{CC}$ | 0 |
| N-well | $V_{CC}$ to 8 | $V_{CC}$ to 8 | $V_{CC}$ | $V_{CC}$ to 12 |
| Control Gate | 0 to 6 | 0 to 6 | 0 to 3 | −5 to −15 |
| Substrate | 0 | 0 | 0 | 0 |
| Write Source | at N-well | at N-well | d/c | at N-well |

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For instance, present embodiments may be fabricated using a suitable triple-well technology and, in some embodiments, twin-well technology is employed. In triple-well technologies, the p-well formed the n-well may be negatively biased during erasing operations to enhance erase speeds.

What is claimed is:

1. A single-poly floating gate memory cell having a PMOS write path and an NMOS read path, the memory cell comprising:

a PMOS storage element comprising a half-transistor having a polysilicon floating gate and a buried control gate;

a PMOS write select transistor coupled in series with the PMOS half-transistor;

an NMOS read transistor having as a gate the polysilicon floating gate of the PMOS half-transistor; and an NMOS read select transistor coupled in series with the NMOS read transistor.

2. The memory cell of claim 1, wherein the control gate comprises an N type diffusion region formed within an associated P type diffusion region.

3. The memory cell of claim 1, wherein during programming operations electrons are injected into the floating gate from the PMOS write path without a channel current.

4. The memory cell of claim 1, wherein during reading operations, a channel current flows in the NMOS read path only if the floating gate is in an erased state.

5. The memory cell of claim 1, wherein during erasing operations electrons tunnel from the floating gate into a P+ diffusion region formed within an N-well within which the PMOS transistors are formed.

6. The memory cell of claim 1, wherein the memory cell is programmed by the injection of hot electrons.

7. The memory cell of claim 6, wherein the NMOS read transistor comprises a depletion mode transistor.

8. The memory cell of claim 6, wherein the NMOS read select transistor comprises an enhancement mode transistor.

9. The memory cell of claim 6, wherein dopants are implanted into a channel region of the PMOS half transistor 50 using an angled implantation technique.

10. A single-poly floating gate memory cell having a PMOS write path and an NMOS read path, the memory cell comprising:

first and second P+ diffusion regions formed in an N-well of a P-type substrate and having a first P-channel extending therebetween, wherein the first and second P+ diffusion regions form the PMOS write path;

a write select gate overlying the first P-channel extending between the first and second P+ diffusion regions;

a buried diffusion region formed in the N-well and electrically isolated from the first P+ diffusion region by a field oxide region, the buried diffusion region serving as a control gate;

a floating gate substantially overlying the control gate and a portion of the first P+ diffusion region;

a second P-channel underlying the floating gate and extending between the first P+ diffusion region and the field oxide region; and first and second N+ diffusion regions formed in the P-type substrate and having an N-channel extending therebetween and underlying a portion of the floating gate such that the floating gate serves as a gate for the N-channel, wherein the first and second N+ diffusion regions form the NMOS read path.

11. The memory cell of claim 10, wherein the first and second P+ diffusion regions serve as respective source and drain regions of a PMOS write select transistor and the first and second N+ diffusion regions serve as respective source and drain regions of an NMOS read transistor, the write select gate controlling the write select transistor and the floating gate controlling the read transistor.

12. The memory cell of claim 11, wherein the first P+ diffusion region serves as a drain of a PMOS half-transistor.

13. The memory cell of claim 11, wherein during a program operation the floating gate is charged using hot electron injection induced by a band-to-band tunneling of electrons from the first P+ diffusion region to the N-well region.

14. The memory cell of claim 13, wherein approximately between 5 and 15 volts are connected to the control gate, approximately between −3 and −10 volts are connected to the drain of the write select transistor, and approximately between −5 and −12 volts are connected to the write select gate while the drain of the read transistor is floating.

15. The memory cell of claim 11, wherein during a read operation a read current flowing in the NMOS read path is indicative of the logic state of the memory cell.

16. The memory cell of claim 15, wherein the source of the read transistor is grounded, approximately between −1 and 3 volts are connected to the control gate, a voltage supply $V_{CC}$ is connected to the write select gate, and approximately between 0.5 and 5 volts are connected to the drain of the read transistor.

17. The memory cell of claim 11, wherein during an erase operation electrons tunnel from the floating gate into the N-well and into the first and second P+ diffusion regions.

18. The memory cell of claim 17, wherein approximately between −5 and −15 volts are connected to the control gate, approximately between $V_{CC}$ and 12 volts is connected to the N-well and the drain of the write select transistor, and the gate of the write select transistor is grounded.

19. The memory cell of claim 10, wherein the control gate comprises an N type diffusion region formed within an associated P type diffusion region.

20. The memory cell of claim 10, further comprising a third N+ diffusion region formed in the P-type substrate and a second N-channel extending between the second and third N+ diffusion regions, the second and third N+ diffusion regions serving as source and drain regions of an NMOS read select transistor.

21. The memory cell of claim 20, wherein the write select gate serves as a gate for both the PMOS write select transistor and for the NMOS read select transistor.

22. The memory cell of claim 21, wherein during a program operation the floating gate is charged using hot electron injection from a channel of the PMOS write transistor.

23. The memory cell of claim 22, wherein approximately between 0 and 6 volts are connected to the control gate, approximately between −2 and 1 volts are connected to the drain of the write select transistor, and approximately between −3 and 0 volts are connected to the write select gate while the drain of the read transistor is floating.

24. A single-poly floating gate memory cell having a PMOS write path and an NMOS read path, the memory cell comprising:
    a PMOS write transistor having a polysilicon floating gate and a buried control gate;
    a PMOS write select transistor coupled in series with the PMOS write transistor;
    an NMOS read transistor having as a gate the polysilicon floating gate of the PMOS write transistor; and
    an NMOS read select transistor coupled in series with the NMOS read transistor.

25. The memory cell of claim 24, wherein the control gate comprises an N type diffusion region formed within an associated P type diffusion region.

26. The memory cell of claim 24, wherein during programming operations channel hot electrons are injected into the floating gate of the PMOS write transistor.

27. The memory cell of claim 24, wherein during reading operations, a channel current flows in the NMOS read path only if the floating gate is in an erased state.

28. The memory cell of claim 24, wherein during erasing operations electrons tunnel from the floating gate into a P+ diffusion region formed within an N-well within which the PMOS transistors are formed.

29. The memory cell of claim 24, wherein the NMOS read transistor comprises a depletion mode transistor.

30. The memory cell of claim 24, wherein the NMOS read select transistor comprises an enhancement mode transistor.

* * * * *